US012701745B2

(12) United States Patent
Vega et al.

(10) Patent No.: US 12,701,745 B2
(45) Date of Patent: Aug. 4, 2026

(54) MULTI-GATE TRANSISTOR WITH CONCAVE AND CONVEX EDGES

(71) Applicant: INTERNATIONAL BUSINESS MACHINES CORPORATION, Armonk, NY (US)

(72) Inventors: Reinaldo Vega, Mahopac, NY (US); Takashi Ando, Eastchester, NY (US); James P. Mazza, Saratoga Springs, NY (US); Nicholas Anthony Lanzillo, Wynantskill, NY (US); David Wolpert, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 443 days.

(21) Appl. No.: 18/365,990

(22) Filed: Aug. 5, 2023

(65) Prior Publication Data
US 2025/0048675 A1 Feb. 6, 2025

(51) Int. Cl.
H10D 30/67 (2025.01)
H10D 30/01 (2025.01)
(Continued)

(52) U.S. Cl.
CPC ....... H10D 30/6729 (2025.01); H10D 30/014 (2025.01); H10D 30/43 (2025.01);
(Continued)

(58) Field of Classification Search
CPC .. H10D 30/6729; H10D 30/014; H10D 30/43; H10D 30/6735; H10D 62/121;
(Continued)

(56) References Cited

U.S. PATENT DOCUMENTS

| 8,212,336 B2 | 7/2012 | Goebel et al. |
| 8,838,801 B2 | 9/2014 | Alapati et al. |
| (Continued) | | |

FOREIGN PATENT DOCUMENTS

| CN | 113053751 A | 6/2021 |
| WO | 2018182675 A1 | 10/2018 |
| WO | 2019153724 A1 | 8/2019 |

OTHER PUBLICATIONS

Imoto et al. ( "Novel Asymmetric Raised Source/Drain Extension MOSFET," 2006 International Conference on Simulation of Semiconductor Processes and Devices, Monterey, CA, USA, 2006, pp. 385-388—NPLImoto06) (Year: 2006).*
Casimiro, M. et al., "Lynceus: Cost-efficient Tuning and Provisioning of Data Analytic Jobs", arXiv:1905.02119v2 (2020), 13 pgs.
Zhang, C. et al., "MArk: Exploiting Cloud Services for Cost-Effective, SLO-Aware Machine Learning Inference Serving", USENIX Association (2019), 15 pgs.

(Continued)

*Primary Examiner* — Christine S. Kim
*Assistant Examiner* — Nathalie R Fayette
(74) *Attorney, Agent, or Firm* — Scully, Scott, Murphy & Presser, P.C.; Kimberly Zillig

(57) ABSTRACT
A semiconductor device includes a substrate and a transistor positioned on the substrate. The transistor includes transistor includes a channel region, a shared gate region, and a source and drain region. The source and drain region includes a concave outer wall includes a concave outer wall. A method of manufacturing a semiconductor device includes providing a substrate and forming a plurality of transistor gate structures on the substrate. A source and drain region are formed and positioned adjacent the plurality of transistor gate structures. A concave wall is recessed into material of the source and drain region toward a centerline of the source and drain region.

16 Claims, 9 Drawing Sheets

(51) Int. Cl.

| | |
|---|---|
| *H10D 30/43* | (2025.01) |
| *H10D 62/10* | (2025.01) |
| *H10D 64/01* | (2025.01) |

(52) U.S. Cl.
CPC ....... *H10D 30/6735* (2025.01); *H10D 62/121*
(2025.01); *H10D 64/01* (2025.01)

(58) Field of Classification Search
CPC .... H10D 64/01; H10D 64/017; H10D 30/019;
H10D 30/501; H10D 30/6757; H10D
64/256; H10D 62/151; B82Y 10/00
See application file for complete search history.

(56) References Cited

U.S. PATENT DOCUMENTS

| | | | | |
|---|---|---|---|---|
| 8,912,606 | B2 | 12/2014 | Baldauf | |
| 9,431,529 | B2 | 8/2016 | Hatcher | |
| 9,634,092 | B2 | 4/2017 | Bhuwalka | |
| 10,340,359 | B2 | 7/2019 | Smith | |
| 10,374,086 | B2 | 8/2019 | Hu | |
| 10,522,683 | B2 | 12/2019 | Kim | |
| 10,713,073 | B2 | 7/2020 | Liu et al. | |
| 11,508,751 | B2 | 11/2022 | Cho | |
| 12,245,440 | B2* | 3/2025 | Kim | H10D 30/6713 |
| 2014/0280946 | A1 | 9/2014 | Mukherjee et al. | |
| 2017/0148682 | A1 | 5/2017 | Basker et al. | |
| 2022/0059653 | A1* | 2/2022 | Chen | H01L 21/28114 |
| 2022/0102346 | A1 | 3/2022 | Lilak | |
| 2022/0199773 | A1 | 6/2022 | Rachmady | |

OTHER PUBLICATIONS

Zhang, X. et al., "ResTune: Resource Oriented Tuning Boosted by Meta-Learning for Cloud Databases", SIGMOD Virtual Event (2021), 13 pgs.

Raj, J. et al., "Towards Designing a Self-Managed Machine Learning Inference Serving System in Public Cloud", arXiv:2008. 09491v1 [cs.DC] (2020), 8 pgs.

Liu, Y. et al., "Cloud Configuration Optimization for Recurring Batch-Processing Applications", IEEE Transactions on Parallel and Distributed Systems, vol. 34:5 (2023); pp. 1495-1507.

Yin, C. et al., "Fabrication of Raised S/D Gate-All-Around Transistor and Gate Misalignment Analysis", IEEE Electron Device Letters (2003), vol. 24:10, pp. 658-660.

Bhoj, A.N. et al., "3-D-TCAD-Based Parasitic Capacitance Extraction for Emerging Multigate Devices and Circuits", IEEE transactions on very large scale integration (VLSI) systems (2013), vol. 21:11, pp. 2094-2105.

Dixit, A. et al., "Analysis of the Parasitic S/D Resistance in Multiple-Gate FETs", IEEE Transactions on Electron Devices (2005), vol. 52:6, pp. 1132-1140.

Eneman, G. et al., "Gate Influence on the Layout Sensitivity of Si1-xGex S/D and Si1-yCy S/D Transistors Including an Analytical Model", IEEE Transactions on Electron Devices (2008), vol. 55:10, pp. 2703-2711.

List of IBM Patents or Patent Applications Treated as Related, dated Aug. 5, 2023, 2 pgs.

* cited by examiner

MULTI-GATE TRANSISTOR WITH CONCAVE AND CONVEX EDGES

BACKGROUND

Technical Field

The present disclosure generally relates to semiconductor device fabrication, and more particularly, to a multi-gate transistor with concave and convex edges.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FinFETs can be formed with the channel extending outward from the substrate, but where the current flows vertically, as compared to a MOSFET with a single planar gate. Depending on the doping of the source and drain, an n-FET or a p-FET may be formed.

The FinFET is a type of MOSFET. The FinFET is a multiple-gate MOSFET device that mitigates the effects of short channels and reduces drain-induced barrier lowering. The "fin" refers to a semiconductor material patterned on a substrate that often has three exposed surfaces that form the narrow channel between source and drain regions. A thin dielectric layer arranged over the fin separates the fin channel from the gate. Because the fin provides a three-dimensional surface for the channel region, a larger channel length can be achieved in a given region of the substrate as opposed to a planar FET device.

As semiconductor devices scale to smaller dimensions, vertical FET devices provide advantages. A vertical FET often comprises an active source/drain region layer arranged on a substrate. A bottom spacer layer is arranged on the active source/drain region layer. The channel region of the FET device is arranged on the bottom spacer layer. The channel region can include any number of shapes including a fin shape.

The gate stack is arranged on the bottom spacer layer and around the channel region. A top spacer layer is arranged on the gate stack. The spacers are used to define the channel region in active areas of a semiconductor substrate located adjacent to the gate.

SUMMARY

According to an embodiment of the present disclosure, a semiconductor device includes a substrate and a transistor positioned on the substrate. The transistor includes a channel region, a shared gate region, and a source and drain region. The source and drain region includes a concave outer wall.

According to another embodiment of the present disclosure, a semiconductor device includes a substrate and a transistor positioned on the substrate. The transistor includes a channel region, a shared gate region, and a source and drain region. The source and drain region includes a curved outer wall.

According to another embodiment of the present disclosure, a method of manufacturing a semiconductor device is provided. The method includes providing a substrate. A plurality of transistor gate structures are formed on the substrate. A source and drain region positioned adjacent the plurality of transistor gate structures is formed. A concave wall is recessed into material of the source and drain region toward a centerline of the source and drain region.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

Overview

Figure 1A:
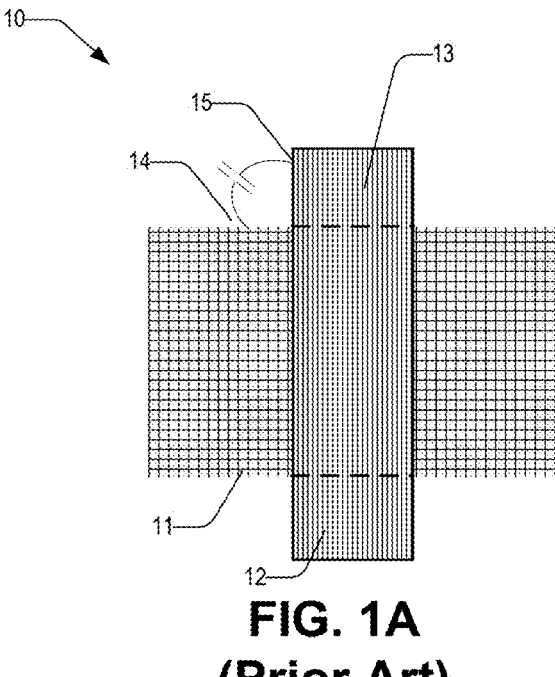
FIG. 1A is a schematic top view of a gate and source and drain structure formation for a conventional semiconductor device.

In general, the subject technology reduces the parasitic capacitance in semiconductor devices such as multi-gate transistors and FinFETS. In general, the embodiments use concave or curved surfaces near the interface of gate regions and source and drain regions. The concave or curved surfaces increase the distance between walls of the source and drain region to, for example, walls of inactive parts of the gate region. By increasing the distance between walls, parasitic capacitance from the inactive gate region is mitigated.

According to an embodiment of the present disclosure, a semiconductor device includes a substrate and a transistor positioned on the substrate. The transistor includes a channel region, a shared gate region and, a source and drain region. The source and drain region includes a concave outer wall.

In one embodiment, the gate region includes a convex wall that is positioned adjacent the concave outer wall of the active region. The convex wall helps remove parasitic capacitance in the relationship between the inactive gate region wall and the source and drain active region's wall by increasing the distance. The convex wall slopes away from the concave outer wall thus increasing the edge capacitance angle and lowering capacitance.

According to one embodiment, which can be combined with one or more previous embodiments, an arrangement of the concave outer wall positioned adjacent the convex wall of the shared gate region defines a sloped line gradually descending from an apex of the convex wall of the shared gate region to a nadir of the concave outer wall of the active region. The line descending from the convex wall to the bottom of the concave wall minimizes the capacitance between the two walls to nearly zero.

According to one embodiment, which can be combined with one or more previous embodiments, an arrangement of the concave outer wall positioned adjacent the convex wall of the shared gate region defines a sinusoidal surface. The curvature of the sinusoidal interface between the gate and the source and drain region creates an angle that is greater than 90 degrees which reduces the edge capacitance.

According to one embodiment, which can be combined with one or more previous embodiments, the convex wall is an inactive region of the shared gate region. The inactive region of the gate does not provide any meaningful contribution to the switching operation of the device. When the inactive gate region includes a convex wall at the interface with the source and drain, the curvature of the convex wall increases the distance of the inactive gate region to the source and drain. Increasing the distance further reduces parasitic capacitance between the two walls.

According to one embodiment, which can be combined with one or more previous embodiments, a first slope of the concave outer wall of the source and drain region is aligned with a second slope of the convex wall of the shared gate region. When aligned, the two slopes form a nearly straight line or surface. A straight line or surface means that the edge capacitance is reduced to nearly zero since the distance between the two walls approaches infinity.

According to one embodiment, which can be combined with one or more previous embodiments, the source and drain region is metallic. The shape of a metallic source and drain region is easier to control during an etch process when both the gate and source and drain are metal.

According to one embodiment, which can be combined with one or more previous embodiments, the semiconductor device is a multi-gate transistor. In multi-gate transistors, the scale for manufacturing is generally in the nanometer scale or smaller. At such small scales, the distance between the walls of the source and drain and the inactive region of the gate contributes an appreciable amount of parasitic capacitance. For multi-gate transistors, there are multiple edge interfaces that contribute parasitic capacitance, so using a concave wall at each source and drain to gate interface reduces the edge capacitance in the device much more than in a conventional single gate device.

According to another embodiment of the present disclosure, a semiconductor device includes a substrate and a transistor positioned on the substrate. The transistor includes a channel region, a shared gate region, and a source and drain region. The source and drain region includes a curved outer wall.

According to one embodiment, which can be combined with the previous embodiment, the curved outer wall is recessed inward from an extremity of the source and drain region. Recessing the curved outer wall of the source and drain region inward increases its distance from the gate region walls that are positioned near the extremities of the source and drain region. By recessing the source and drain region inward, the distance of source and drain material from the gate region continually increases as the curved wall approaches the center of the source and drain.

According to one embodiment, which can be combined with one or more previous embodiments, a nadir of the curved outer wall is proximate a center line of the source and drain region. Having the nadir near the centerline of the source and drain region means that there is a substantial slope in the curved wall. A slope whose nadir that terminates near the center of the source and drain region means that the distance between the gate region and the source and drain only becomes larger as the slope approaches the nadir. A larger distance between the gate and the source and drain region means the parasitic capacitance decreases as the curved wall approaches the nadir.

According to one embodiment, which can be combined with one or more previous embodiments, the device also includes a sloped outer surface of the shared gate region. An end of the curved outer wall of the source and drain region is adjacent the sloped outer surface of the shared gate region. By adding a slope to the gate region, the contribution of parasitic capacitance from the gate region side of the interface is also reduced.

According to one embodiment, which can be combined with one or more previous embodiments, the sloped outer surface is an inactive region of the shared gate region. Since the inactive region does not provide any meaningful contribution to the switching operation of the device, sloping the surface of the inactive region further reduces parasitic capacitance and improves the overall efficiency of the device by reducing the impact from a non-contributory element.

According to one embodiment, which can be combined with one or more previous embodiments, the curved outer wall is symmetric about a center line of the source and drain region. As may be appreciated, embodiments may include gate-all-around structures and the interface of the source and drain region with the gate may be present at multiple points. A symmetric wall reduces the parasitic capacitance with the gate evenly around the centerline of the source and drain region.

According to one embodiment, which can be combined with one or more previous embodiments, the semiconductor device is a multi-gate transistor. In multi-gate transistors, the scale for manufacturing is generally in the nanometer scale or smaller. At such small scales, the distance between the walls of the source and drain, and the inactive region of the gate contributes an appreciable amount of parasitic capacitance. For multi-gate transistors, there are multiple edge interfaces that contribute parasitic capacitance, so using a concave wall at each source and drain to gate interface reduces the edge capacitance in the device much more than in a conventional single gate device.

According to another embodiment of the present disclosure, a method of manufacturing a semiconductor device is provided. The method includes providing a substrate. A plurality of transistor gate structures are formed on the substrate. A source and drain region positioned adjacent the plurality of transistor gate structures is formed. A concave wall is recessed into material of the source and drain region toward a centerline of the source and drain region.

According to one embodiment, which can be combined with the previous embodiment, the method also includes etching a convex wall from the transistor gate structures. Etching a convex wall into the transistor gate structures further increases the distance between the gate structures, and source and drain region, which further reduces the parasitic capacitance in the device.

According to one embodiment, which can be combined with any of the previous embodiments, the method further includes masking the transistor gate structures and the source and drain region with a sinusoidal pattern prior to recessing the concave wall and etching the convex wall. The mask creates a sinusoidal surface in the interface between the source and drain, and the gate structures which continuously defines an immeasurable angle between the structures so that edge capacitance is nearly zero no matter the point on the sinusoidal surface.

According to one embodiment, which can be combined with any of the previous embodiments, the source and drain region is filled with metal. When the source and drain is metallic, the source and drain can be more accurately shaped with etching processes to form the curvature of the source and drain region. The resulting curvature that becomes possible with a metallic source and drain provides reduced (e.g., minimal) parasitic capacitance with the inactive gate material near the source and drain.

Referring to FIG. 1A, in a conventional transistor device 10, a source and drain region 11 is positioned adjacent a gate region 12. The section of the gate region 12 that overlaps the source and drain region 11 is the active gate region. The sections 13 of the gate region 12 that extend beyond the active gate region provide no benefit to the operation of the transistor device 10; in other words, are inactive gating regions which do not help in switching. Generally speaking, the arrangement of the source and drain region 11 and the gate region 12 are orthogonal to each other. For example, as can be seen in FIG. 1A, the sidewall 15 of the gate region 12 is generally at a right angle relative to the sidewall 14 of the source and drain region 11. While the sidewall 15 of the gate region (which is part of the inactive gate region) adds little to no value, its presence relative to the sidewall 14 of the source and drain region 11 adds a degree of parasitic capacitance (sometimes called the "edge capacitance"). As the scale of transistor elements becomes smaller, the distance between the sidewall 15 of the gate region to the sidewall 14 of the source and drain region 11 becomes a factor in contributing parasitic capacitance in the transistor device 10.

For the sake of brevity, conventional techniques related to semiconductor device and integrated circuit (IC) fabrication may or may not be described in detail herein (for example, the process leading up to the formation shown in FIG. 3B below). Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the direction of the Figures being described. Since components of embodiments of the disclosure can be positioned in a number of different directions, the directional terminology is used for purposes of illustration and is in no way limiting. Thus, it will be understood that the spatially relative terminology is intended to encompass different directions of the device in use or operation in addition to the direction depicted in the figures. For example, if the device in the figures is turned over, elements described as "below" or "beneath" other elements or features would then be oriented "above" the other elements or features. Thus, for example, the term "below" can encompass both an orientation that is above, as well as, below. Similarly, an element described as "on top of" of another element may mean either that the element is positioned above and is not necessarily in direct contact with the underlying element. The device may be otherwise oriented (rotated 90 degrees or viewed or referenced at other directions) and the spatially relative descriptors used herein should be interpreted accordingly.

As used herein, the terms "lateral", "planar", and "horizontal" describe an orientation parallel to a first surface of a chip or substrate. In the disclosure herein, the "first surface" may be the top layer of a semiconductor device where individual circuit devices are patterned in the semiconductor material.

As used herein, the term "vertical" describes an orientation that is arranged perpendicular to the first surface of a chip, chip carrier, chip substrate, or semiconductor body.

As used herein, the terms "coupled" and/or "electrically coupled" are not meant to mean that the elements must be directly coupled together-intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together. The phrase "electrically connected" does not necessarily mean that the elements must be directly in physical contact together-intervening elements may be provided between the "connected" or "electrically connected" elements.

Although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. Nor does describing an element as "first" or "second", etc. necessarily mean that there is an order or priority to any of the elements. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope. It should be appreciated that the figures and/or drawings accompanying this disclosure are exemplary, non-limiting, and not necessarily drawn to scale.

It is to be understood that other embodiments may be used, and structural or logical changes may be made without departing from the spirit and scope defined by the claims. The description of the embodiments is not limiting. In particular, elements of the embodiments described hereinafter may be combined with elements of different embodiments.

Definitions

Source and Drain: A region of electron carrying material that acts as terminals in a transistor for the flow of charge.

Gate Region: A region of material in a transistor adjacent the source and drain that controls flow through the source and drain when a voltage is applied.

Inactive Gate Region: A region of gate material that is excess and does not contribute to switching in a transistor. The non-active region may be positioned outside the range of the source and drain.

Self-aligned: The patterning of a structure relative to alignment with another structure.

Substrate: Reference to a substrate may refer to material that provides a support structure to features in or on top of the substrate material. As used below, there may be more than one substrate present in an embodiment shown. Also, since embodiments below are generally shown in cross-section, it should be understood that a substrate for a layer with patterned features may not be visible in the view so as to highlight the features for the layer.

Example Device Structure

Figure 1B:
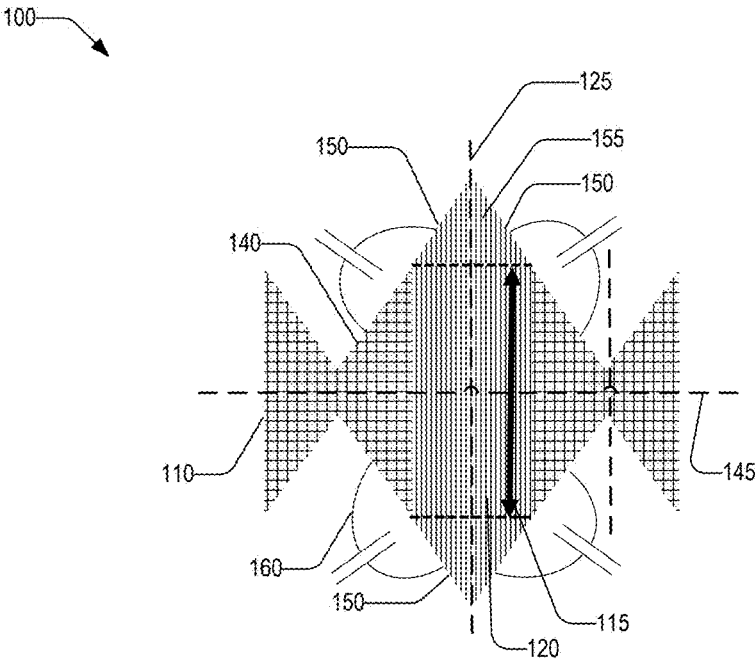
FIG. 1B is a schematic top view of a gate and source and drain structure formation for a semiconductor device, consistent with embodiments of the present disclosure.

Referring now to FIG. 1B, the subject disclosure provides a transistor device 100 that mitigates the parasitic capacitance that can form between the sidewall 140 of a source and drain 110 and the sidewall 150 of a gate region 120. The transistor device 100 may be for example, a finFET or a multi-gate type device. In some embodiments, the gate region 120 may be shared by multiple channels ("channel region") that are stacked in the transistor device 100. In an exemplary embodiment, the edge or sidewall 140 of the source and drain 110 is recessed inward toward a center of the source and drain 110 region. For example, the edge or sidewall 140 of the source and drain 110 is recessed toward a centerline 145 of the gate region 120 that runs transverse to a centerline 125 that runs axially in the gate region 120. In some embodiments, the slope for the edge (sidewall 140) of the source and drain 110 may be linear while moving away from the intercept point with the gate region 120 that is beyond the active gate area (the inactive gate region 155). The active gate area is the region represented by the distance 115 between the two broken lines as demarcated by the double arrow line. The inactive gate area 155 includes the two triangle shaped sections of the gate region 120 that extend past the extremities of the two broken lines. As can be seen, the distance of the sidewall 140 to the intercept with the sidewall 150 of the inactive gate region 155 has increased relative to the distance of analogous surfaces in conventional transistor arrangements (for example, as shown in FIG. 1A). The distance continues to increase as the sidewall 140 slopes toward the centerline of the source and drain 110. In some embodiments, the sidewall 140 has a nadir and the surface reverses direction with an upward grade that may terminate back to the same level as the intercept with the gate region 120. As shown in the drawing, both of the top and bottom sidewalls 140 of the source and drain 110 may be symmetrically recessed inward.

As will be appreciated, the structure of the source and drain 110 increases the distance between the sidewall 140 to the sidewall 150 of the gate region 120. The effect produces an angle 160 between the sidewall 140 and sidewall 150 that is greater than 90 degrees and may be less than 180 degrees. The angle 160 is called out by the symbols representing capacitance for the adjacent walls since the capacitance is based on the distance and angle between the walls. In some embodiments, crystallographic etching may be used to recess the source and drain 110 to produce the angle of the sidewall 140. In one embodiment, the sidewall 140 may be provided by etching down the material in the source and drain 110 approximately 54.7 degrees more beyond 90 degrees.

Figure 2:
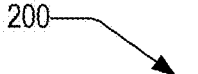
FIG. 2 is a top schematic view of a gate and source and drain structure formation for a semiconductor device, consistent with embodiments of the present disclosure.
Figure 2:
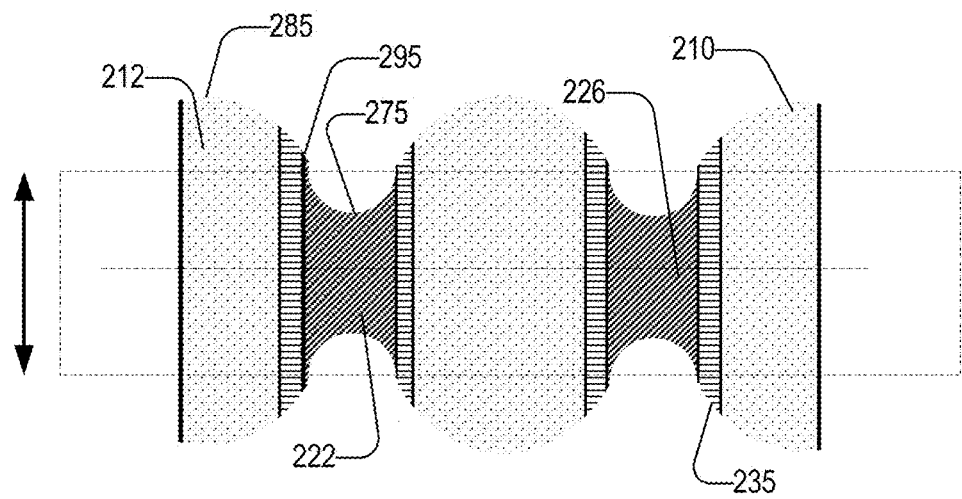

Referring now to FIG. 2, a transistor device 200 is shown according to an embodiment. The transistor device 200 includes a gate region 212 and a source and drain 222. In the perspective shown by FIG. 2, the gating region 212 is covered by a gate cap 210. In some embodiments, a dielectric liner 235 may be positioned around the gate cap 210. An active region 226 of the source and drain 222 is demarcated by the broken line box.

In one embodiment, the active region 226 includes a concave outer wall 275. The concave outer wall 275 may be recessed inward toward a centerline of the active region 226 that runs transversely across multiple instances of the gate region 212. As can be seen, at the nadir of the concave outer wall 275, the thickness of the active region 226 is less than the thickness of the overall area of the source and drain 222. The concave outer wall 275 may taper into a parabolic slope moving away from an interface 295 with one adjacent gate region 212 until it rises again toward a next adjacent gate region 212. In some embodiments, the concave outer wall 275 may be symmetric around the centerline, having a hyperbolic structure. In some embodiments, the gate region 212 may include a convex wall 285. The outer end(s) of the convex wall 285 may descend toward the interface 295 with the upper end of the concave outer wall 275. When the concave outer wall 275 and convex wall 285 are arranged proximate each other, the two surfaces (275 and 285) may have a substantially sinusoidal surface across multiple gate regions 212 and source and drain 222.

Example Methodology of Manufacture

In the following, a process describes a general method of forming a semiconductor device with a concave edge in the source and drain. Embodiments increase the distance between the source and drain and adjacent surfaces of the gate inactive region (when compared to conventional formation of gates and source and drain elements), which reduce parasitic capacitance in the device. The process tapers edges of the source and drain inward to form for example, hourglass shaped source and drain areas. FIGS. 3A and 3B-8A and 8B illustrate an example fabrication process for manufacturing a multi-gate transistor with reduced edge capacitance.

The fabrication of the devices described herein below can comprise multi-step sequences of, for example, photolithographic and/or chemical processing steps that facilitate gradual creation of electronic-based systems, devices, components, and/or circuits in a semiconducting and/or a superconducting device (e.g., an integrated circuit). For instance, device 100 can be fabricated on one or more substrates (e.g., a silicon (Si) substrates, and/or another substrate) by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, and/or another photoresist technique), etching techniques (e.g., reactive ion etching (RIE), dry etching, wet etching, ion beam etching, plasma etching, laser ablation, and/or another etching technique), evaporation techniques, sputtering techniques, plasma ashing techniques, thermal treatments (e.g., rapid thermal anneal, furnace anneals, thermal oxidation, and/or another thermal treatment), chemical vapor deposition (CVD), atomic layer deposition (ALD), physical vapor deposition (PVD), molecular beam epitaxy (MBE), electrochemical deposition (ECD), chemical-mechanical planarization (CMP), backgrinding techniques, and/or another technique for fabricating an integrated circuit.

In one embodiment, the base semiconductor substrate 205 may be a bulk semiconductor substrate formed of, for example, silicon, or other types of semiconductor substrate materials that are commonly used in bulk semiconductor fabrication such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

Figures 3A, 3B:
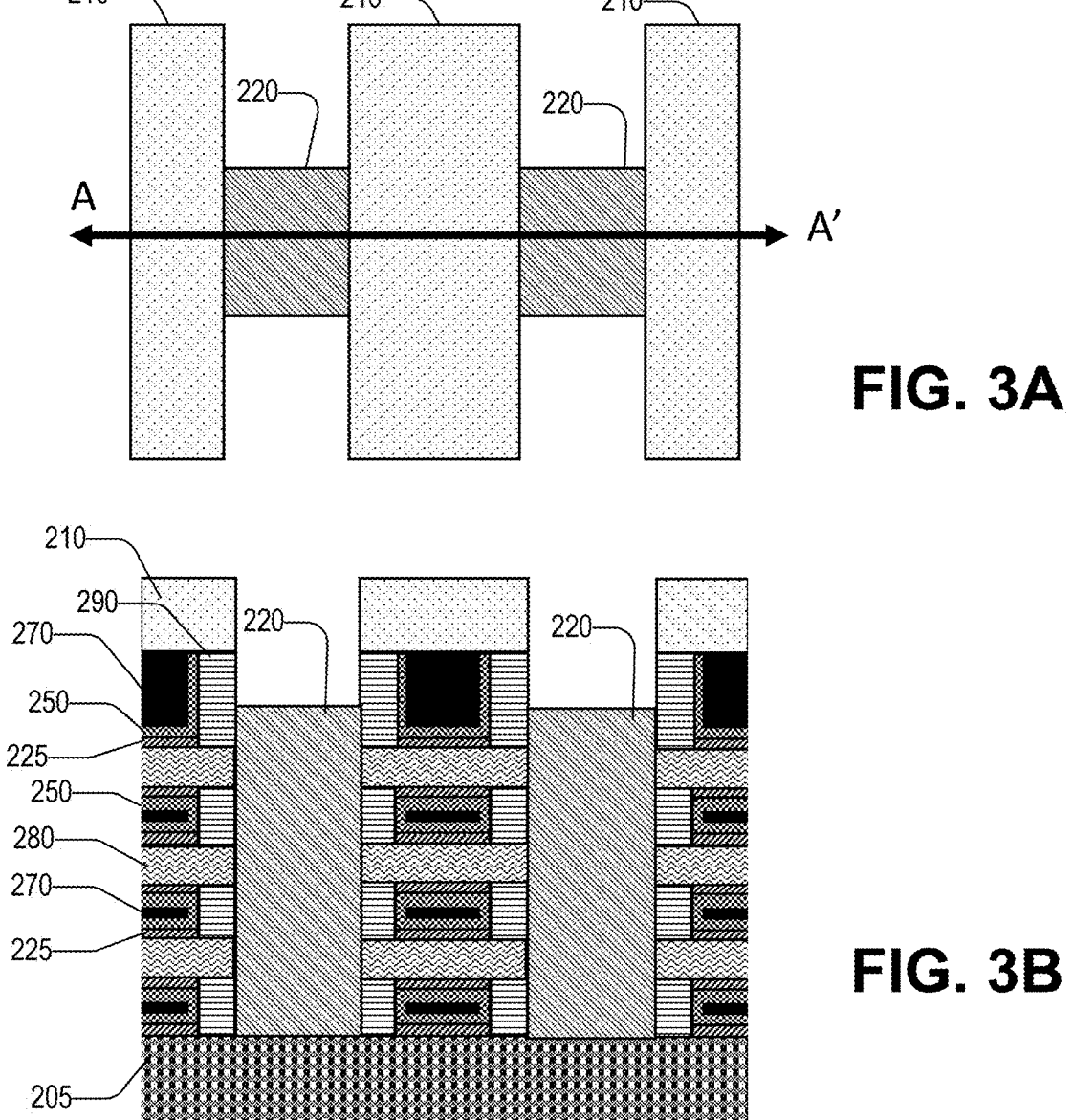
FIG. 3A is a top view of an initial semiconductor device formation showing a gate cap over a source and drain region epitaxial deposition in a multi-gate transistor formation, consistent with an illustrative embodiment.
FIG. 3B is a cross sectional side view of the semiconductor device formation of FIG. 3A taken along the line A-A', consistent with an illustrative embodiment.

Referring now to FIGS. 3A and 3B, an initial semiconductor device formation is shown. FIG. 3B shows the side view along the cross-section taken along line A-A' in FIG. 3A. FIGS. 4B, 5B, 6B, and 7B show the same side view tracking the formation steps in FIGS. 4A, 5A, 6A, and 7A. In the example shown, a nanosheet type, multi-gate vertical FinFET transistor is being manufactured. The initial formation includes multiple nanosheet channels 280 stacked vertically in a channel region. The process may have used a replacement metal gate (RMG) technique that processed the transistor up to the inclusion of metal in the gate areas. Each transistor includes a gate 270, surrounded by a dielectric 250 and spacers 290. An interlayer dielectric 225 (for example, an oxide) separates the gates 270 from nanosheet channels 280 positioned in between successively stacked gates 270. In addition, a semiconductor material epitaxial growth 220 is deposited in between adjacent fins that will be the source and drain. A gate cap 210 layer may be applied over the nanosheet stacks of each fin.

Figures 4A, 4B:
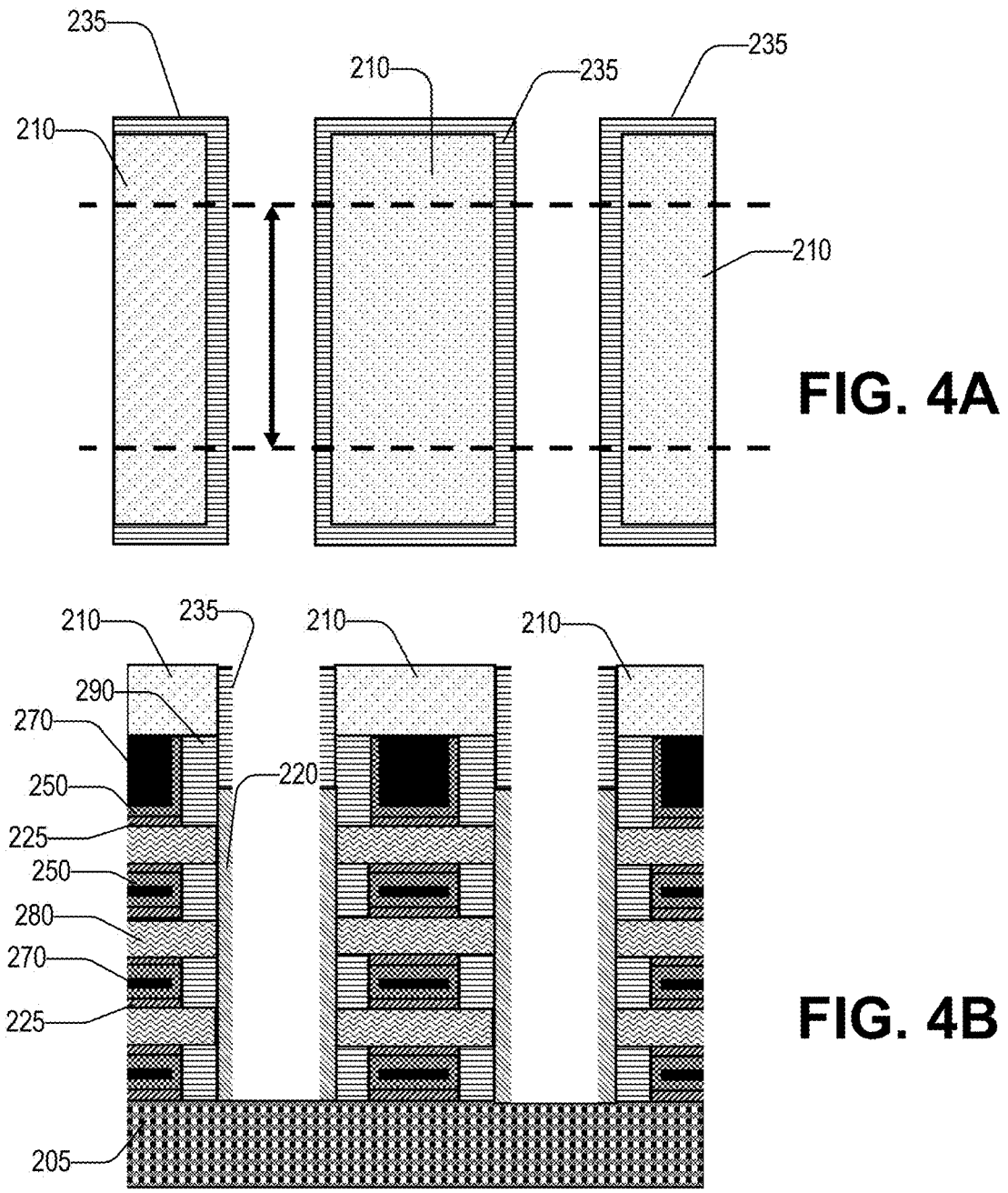
FIG. 4A is a top view of the formation of FIG. 3A after liner deposition and a reactive ion etch is applied to the source and drain epitaxial region, consistent with an illustrative embodiment.
FIG. 4B is a cross sectional side view of the semiconductor device formation of FIG. 4A, consistent with an illustrative embodiment.

FIGS. 4A and 4B show a recess of the semiconductor material epitaxial growth 220 in the formation of FIGS. 3A and 3B. A dielectric liner 235 may be deposited adjacent the gate cap 210 and over the remaining semiconductor material epitaxial growth 220. In some embodiments, a mask may be used where the mask opening is wider than the eventual source and drain area to allow for process margins.

Figures 5A, 5B:
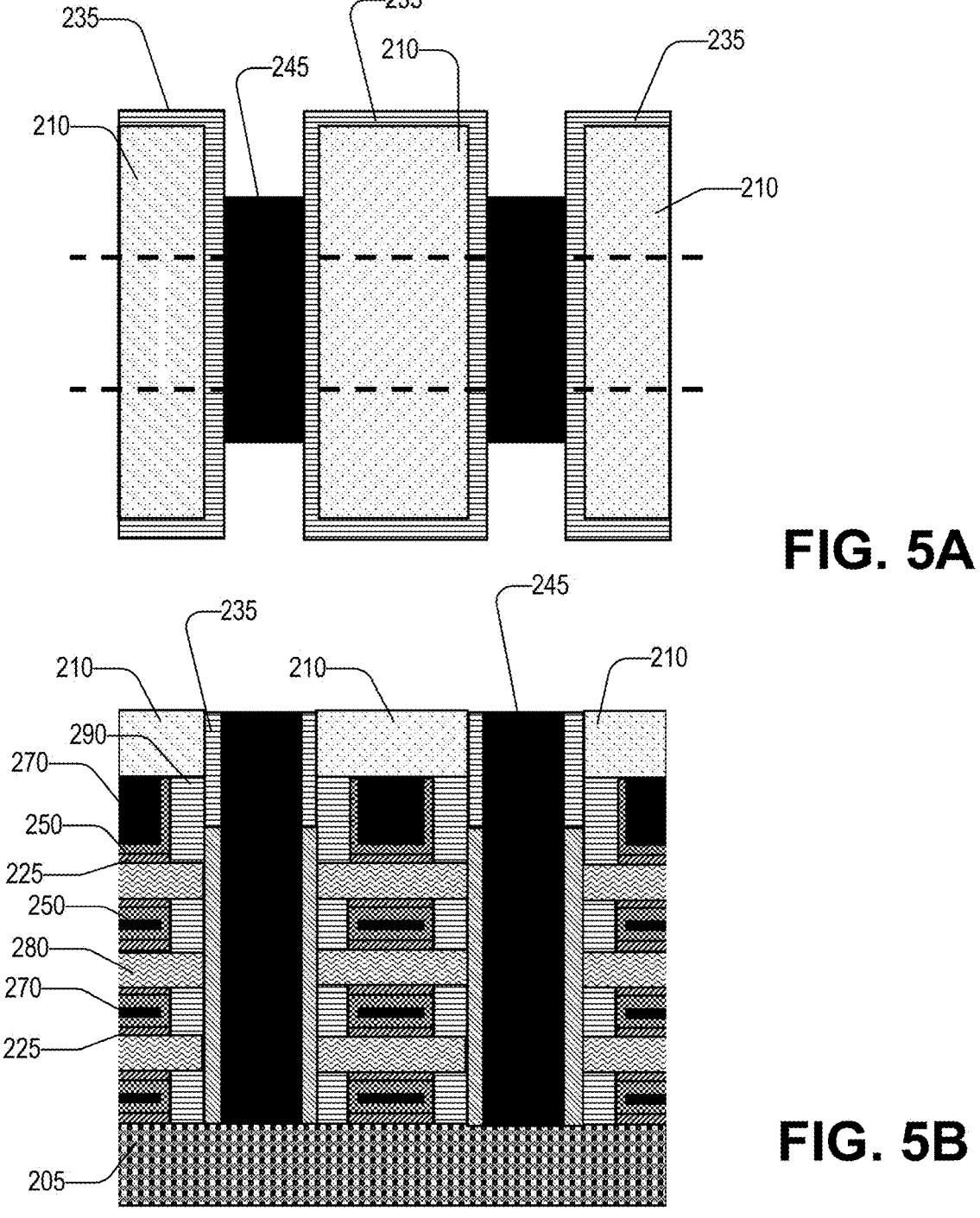
FIG. 5A is a top view of the formation in FIG. 4A after filling the source and drain epitaxial region with a metal, consistent with an illustrative embodiment.
FIG. 5B is a side view of the formation of FIG. 5A, consistent with an illustrative embodiment.

FIGS. 5A and 5B show a process of adding a metallic fill into the source and drain region that was left empty after the recess step in FIGS. 4A and 4B. In some embodiments, silicidation may be used as part of the source and drain metal 245 (which may be for example, tungsten). A planarization process may be used to make the top of the source and drain metal 245 flush with the level of the gate cap 210. Silicide would not necessarily form the entirety of the source and drain metal, but silicidation is helpful in forming a low resistance contact between the metal and the doped portion of the source and drain. Having a metallic source and drain here is beneficial for the concave shaping, because during the same etch process, a convex edge is forming along the gate. When fabricating a semiconductor device using etch chemistry and reactive ion etching development, the fabrication process may be easier to control when the gate and source and drain are both metal.

Figures 6A, 6B:
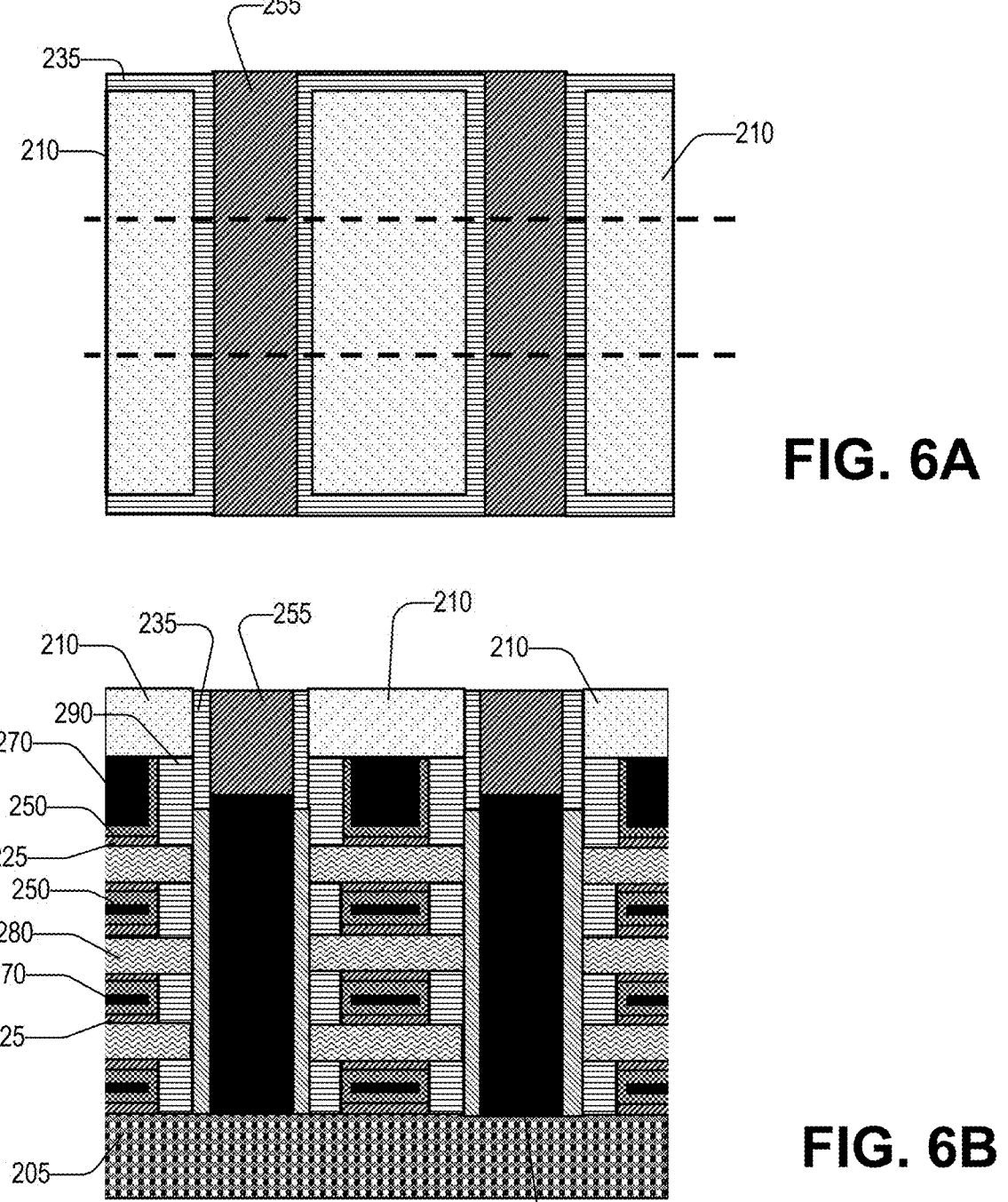
FIG. 6A is a top view of the formation in FIG. 5A after recessing the metallic fill and depositing an interlevel dielectric, consistent with an illustrative embodiment.
FIG. 6B is a side view of the formation of FIG. 6A, consistent with an illustrative embodiment.

FIGS. 6A and 6B show the formation of FIGS. 5A and 5B after recessing down the source and drain metal 245. To ensure that contact with all of the stacked channel regions is made, the level of recess for the source and drain may be performed maintaining the source and drain metal above the top surface of the top-most channel. In some embodiments, the level of recession for the source and drain metal may also be performed until the source and drain metal is below the top surface of the metal gate, which helps reduce capacitance. The areas left empty by removal of the source and drain metal 245 may be back-filled with an interlevel dielectric 255. The interlevel dielectric 255 may be planarized to be flush with the gate cap 210.

Figure 7A:
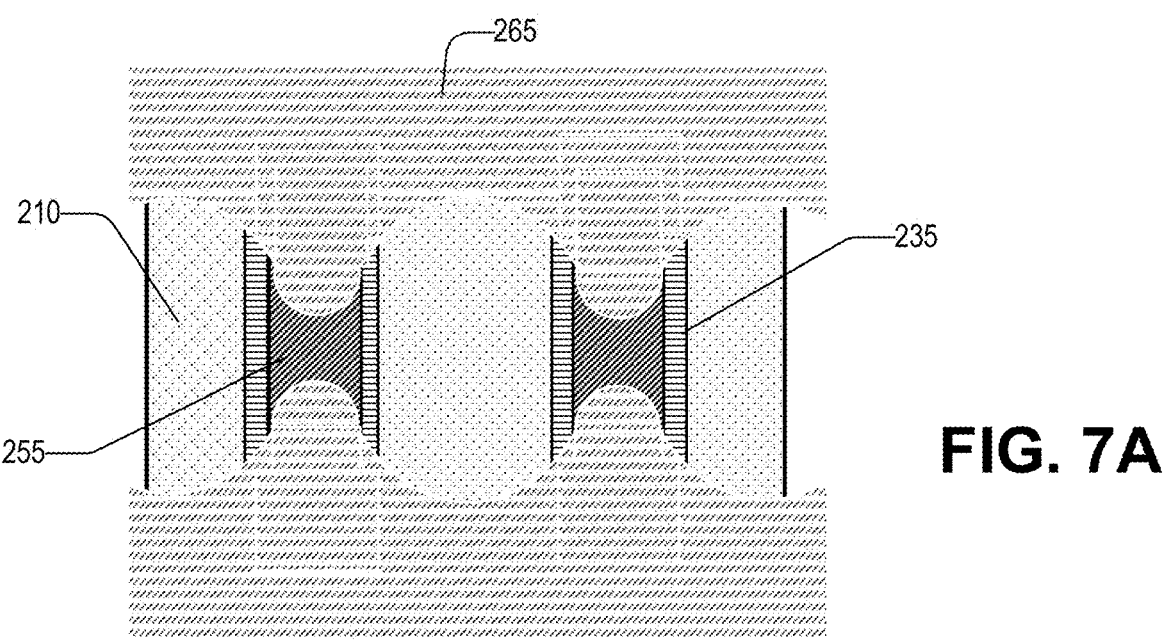
FIG. 7A is a top view of the formation in FIG. 6A after a mask with a sinusoidal pattern is applied over the formation, consistent with an illustrative embodiment.
Figure 7B:
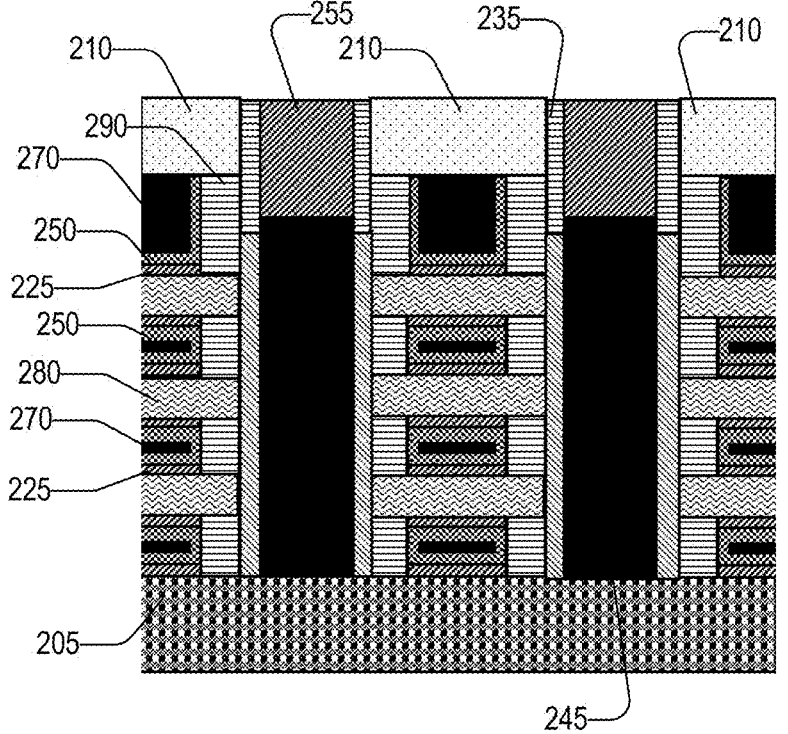
FIG. 7B is a side view of the formation of FIG. 7A, consistent with an illustrative embodiment.

FIGS. 7A and 7B show the application of a mask 265 over the formation shown in FIGS. 6A and 6B. In some embodiments, the mask 265 may have an hourglass pattern (for example, two sinusoidal waves 180 degrees out of phase). In some embodiments, the mask 265 may have a hyperbolic pattern. The innermost peaks of the mask 265 may be aligned for position over the interlevel dielectric 255 and the underlying source and drain metal 245. The outer peaks of the mask 265 may be aligned over the gate caps 210 and underlying gate regions.

Figure 8A:
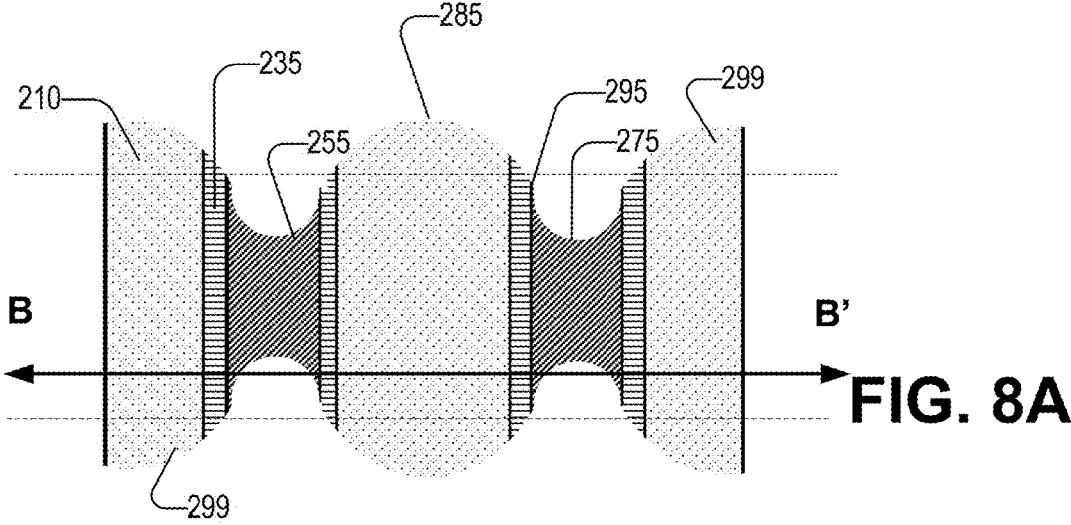
FIG. 8A is a top view of the formation in FIG. 7A after cutting the source and drain region and gate region, consistent with an illustrative embodiment.
Figure 8B:
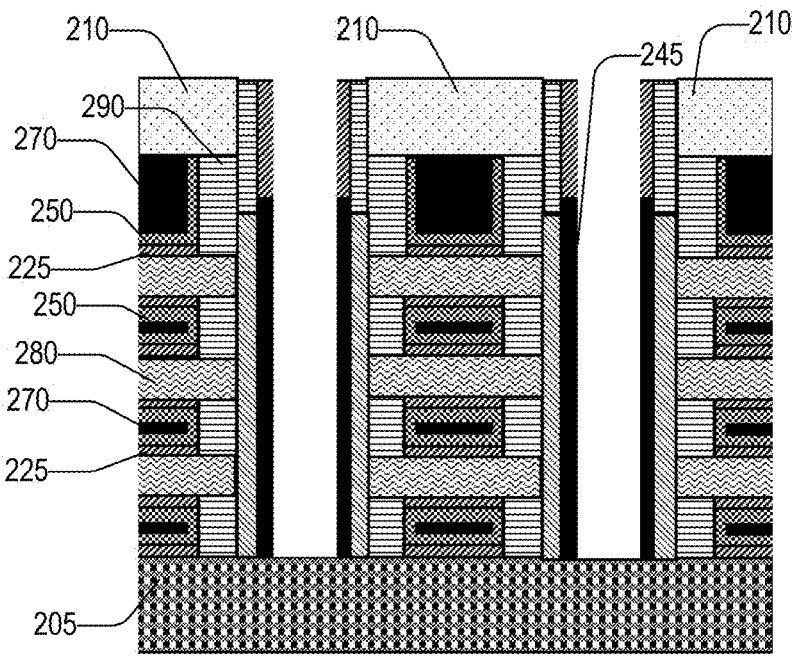
FIG. 8B is a side view of the formation of FIG. 8A taken along the line B-B' of FIG. 8A, consistent with an illustrative embodiment.

FIGS. 8A and 8B show the formation of FIGS. 7A and 7B after a cut process (for example, etching) that has been applied simultaneously to the gate cap 210 (and underlying gate regions) and to the source and drain metal 245. As can be seen, the mask pattern defined a concave outer wall 275 in the source and drain region (i.e, the source and drain metal 245 under the interlevel dielectric 255). In addition, the cut formed a convex wall 285 in the gate regions (under the gate caps 210). A minimal, if not, non-existent amount of the source and drain metal 245 remains adjacent the inactive gate regions 299 (which are outside the broken lines). The slope of the convex wall 285 nearly matches the slope of the concave outer wall 275 at the interface. Since the distance between the two surfaces approaches infinity (i.e., the closer the slopes are to each other, the closer the curvature of the slope becomes flat), the parasitic capacitance due to the presence of inactive gate material being adjacent the source and drain region approaches a minimum value.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits, and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A semiconductor device, comprising:
a substrate; and
a transistor positioned on the substrate, wherein the transistor includes:
    a shared gate region; and
    a source and drain region having an active region,
    wherein the active region of the source and drain region, as viewed from a top down view from above the shared gate region to the substrate, comprises a sidewall present along a sidewall of a channel region of the transistor and a concave outer wall extending outward from an edge of the sidewall of the active region of the source and drain region.

2. The semiconductor device of claim 1, further comprising a convex wall of the shared gate region, positioned adjacent to the concave outer wall of the active region.

3. The semiconductor device of claim 2, wherein an arrangement of the concave outer wall positioned adjacent to the convex wall of the shared gate region defines a sloped line gradually descending from an apex of the convex wall of the shared gate region to a nadir of the concave outer wall of the active region.

4. The semiconductor device of claim 2, wherein an arrangement of the concave outer wall positioned adjacent to the convex wall of the shared gate region defines a sinusoidal surface.

5. The semiconductor device of claim 2, wherein the convex wall is an inactive region of the shared gate region.

6. The semiconductor device of claim 2, wherein a first slope of the concave outer wall of the active region is aligned with a second slope of the convex wall of the shared gate region.

7. The semiconductor device of claim 1, wherein the source and drain region is metallic.

8. The semiconductor device of claim 1, wherein the semiconductor device is a multi-gate transistor.

9. A semiconductor device, comprising:
a substrate; and
a transistor positioned on the substrate, wherein the transistor includes:

a shared gate region; and a source and drain region having an active region, wherein the active region of the source and drain region, as viewed from a top down view from above the shared gate region to the substrate, comprises a sidewall present along a sidewall of a channel region of the transistor and a curved outer wall extending outward from an edge of the sidewall of the active region of the source and drain region.

10. The semiconductor device of claim 9, wherein the curved outer wall is recessed inward from an extremity of the active region.

11. The semiconductor device of claim 9, wherein a nadir of the curved outer wall is proximate a center line of the active region.

12. The semiconductor device of claim 9, further comprising a sloped outer surface of the shared gate region, wherein an end of the curved outer wall of the active region is adjacent to the sloped outer surface of the shared gate region.

13. The semiconductor device of claim 12, wherein the sloped outer surface is an inactive region of the shared gate region.

14. The semiconductor device of claim 9, wherein the curved outer wall is symmetric about a center line of the active region.

15. The semiconductor device of claim 9, wherein the source and drain region is metallic.

16. The semiconductor device of claim 9, wherein the semiconductor device is a multi-gate transistor.

\* \* \* \* \*